US008012260B2

(12) United States Patent
Hoffmann et al.

(10) Patent No.: US 8,012,260 B2
(45) Date of Patent: Sep. 6, 2011

(54) APPARATUS AND METHOD FOR COATING AN AREAL SUBSTRATE

(75) Inventors: Uwe Hoffmann, Alzenau (DE); Jutta Trube, Mömbris (DE); Dieter Haas, Bruchköbel (DE)

(73) Assignee: Applied Materials GmbH & Co. KG, Alzenau (DE)

( * ) Notice: Subject to any disclaimer, the term of this patent is extended or adjusted under 35 U.S.C. 154(b) by 0 days.

(21) Appl. No.: 10/164,337

(22) Filed: Jun. 6, 2002

(65) Prior Publication Data

US 2002/0185069 A1 Dec. 12, 2002

(30) Foreign Application Priority Data

Jun. 11, 2001 (DE) .................................. 101 28 091

(51) Int. Cl.
C23C 16/00 (2006.01)
(52) U.S. Cl. ........................................................ 118/726
(58) Field of Classification Search .................. 118/718, 118/726, 729, 715, 723 VE
See application file for complete search history.

(56) References Cited

U.S. PATENT DOCUMENTS

| | | | |
|---|---|---|---|
| 3,047,438 A * | 7/1962 | Marinace | 117/91 |
| 3,282,243 A * | 11/1966 | Phillips, Jr. et al. | 118/725 |
| 4,356,429 A | 10/1982 | Tang | |
| 4,371,422 A * | 2/1983 | Eidschun | 216/13 |
| 4,401,052 A * | 8/1983 | Baron et al. | 118/718 |
| 4,539,507 A | 9/1985 | Van Slyke | |
| 4,720,432 A | 1/1988 | Van Slyke | |
| 4,769,292 A | 9/1988 | Tang et al. | |
| 4,813,373 A * | 3/1989 | Demay et al. | 118/726 |
| 4,854,266 A * | 8/1989 | Simson et al. | 118/728 |
| 5,550,066 A | 8/1996 | Tang et al. | |
| 6,101,316 A * | 8/2000 | Nagashima et al. | 392/388 |
| 6,237,529 B1 | 5/2001 | Spahn | |
| 6,276,220 B1 * | 8/2001 | Varhol | 73/863.21 |
| 6,367,414 B2 * | 4/2002 | Witzman et al. | 118/723 VE |
| 6,402,849 B2 * | 6/2002 | Kwag et al. | 118/715 |
| 6,475,278 B2 * | 11/2002 | Nakabayashi et al. | 117/200 |
| 6,749,906 B2 * | 6/2004 | Van Slyke | 427/591 |
| 2001/0006827 A1 | 7/2001 | Yamazaki et al. | |
| 2003/0015140 A1 * | 1/2003 | Van Slyke et al. | 118/723 VE |
| 2003/0203638 A1 | 10/2003 | Van Slyke | |

FOREIGN PATENT DOCUMENTS

| | | |
|---|---|---|
| DE | 42 04 938 C1 | 6/1993 |
| DE | 199 21 744 A1 | 11/2000 |
| EP | 0 477 474 A1 | 4/1992 |
| EP | 0 839 925 A | 5/1998 |
| EP | 0 962 260 A1 | 12/1999 |

(Continued)

OTHER PUBLICATIONS

Oblique. The American Heritage® Dictionary of the English Language (2003). Retrieved Nov. 9, 2006, from xreferplus. http://www.xreferplus.com/entry/4113675.*

(Continued)

*Primary Examiner* — Maureen Gramaglia
(74) *Attorney, Agent, or Firm* — Fish & Richardson P.C.

(57) ABSTRACT

An apparatus for coating an areal substrate, for example a rectangular plate comprises a vaporizer source and a distributor system for the supply of vaporized material onto the substrate. The distributor system comprises a line source, with this line source and the substrate is movable relative to one another. The apparatus serves preferably for the production of flat screens with organic light-emitting diodes.

51 Claims, 7 Drawing Sheets

FOREIGN PATENT DOCUMENTS

| | | |
|---|---|---|
| EP | 0 982 411 A2 | 3/2000 |
| JP | 03-185815 | 8/1991 |
| JP | 4236769 | 8/1992 |
| JP | 06-080496 | 3/1994 |
| JP | 11050233 | 2/1999 |
| JP | 11091943 | 4/1999 |
| WO | 96/35822 | 11/1996 |
| WO | 99/25894 | 5/1999 |
| WO | WO-99 25894 A | 5/1999 |
| WO | WO-00 28103 A | 5/2000 |

OTHER PUBLICATIONS

Organische Elektrolumineszenz, Becker, et al. pp. 1-5 (Aug./Sep. 2000).

OLEDS—Senkrechtstarter aus Kunststoff, Lemme, Elektronik 2/200 pp. 97103 (Feb. 2000).

"Molecular beam epitaxy," [online]; [Retrieved online on Jul. 10, 2009]; Retrieved from URL: http://en.wikipedia.org/wiki/Molecular_beam_epitaxy, 3 pages.

* cited by examiner

APPARATUS AND METHOD FOR COATING AN AREAL SUBSTRATE

BACKGROUND AND SUMMARY OF THE INVENTION

The present invention relates to an apparatus for coating an areal substrate, and to methods of using the apparatus to coat substrates.

For over one hundred years the cathode ray tube has been the means of choice for the optical representation of still and/or moving pictures by means of raster-form spot representation. One disadvantage of the cathode ray tube, however, is that it has considerable depth such that, for example, flat television screens cannot be produced with it.

Therefore, for some time attempts have been to produce a flat screen or a flat display. Some of the best known of the structural elements developed over the last years and decades with which flat screens can be produced are light-emitting diodes (LEDs), liquid crystal elements (LCDs) and plasma elements. These modern structural elements, however, still have also specific disadvantages. Thus, conventional LEDs consume relatively significant levels of energy, while plasma elements, which are small fluorescent tubes, cannot be reduced to any desired size. The pixel raster of the plasma elements is limited to approximately 0.5 mm. More recent developments in the production of flat screens are directed toward so-called organic light-emitting diodes (OLEDs). The advantages of these organic light-emitting diodes comprises that at voltages of less than 5 volts they have low energy consumption, are strongly luminous, have a wide radiative angle, can be applied in temperature ranges from −40° C. to +85° C., and are of low weight. In addition, their quantum efficiency, i.e. the number of generated photons per injected electron or hole, has risen to more than 16% (Helmut Lemme: OLEDs—Senkrechtstarter aus Kunststoff, Elektronik 2/2000, p. 98, right column, paragraph 2, No. [5]: Yi He; Janicky, J.: High Efficiency Organic Polymer Light-Emitting Heterostructure Apparatuss, Eurodisplay '99, VDE-Verlag Berlin, Offenbach) and thus above the quantum efficiency of inorganic LEDs from III-V semiconductors. OLEDs thus are choices for applications in battery-operated apparatus. OLEDs are comprised of one or more semiconducting organic layers disposed between two electrodes with at least one of these electrodes, as a rule, being transparent. If an electric field is applied, electrons or holes are injected through the cathode or anode into the transport bands of the organic layer. Both charge carriers migrate toward one another and a certain portion of them recombines, whereby light quanta are generated through spontaneous emission (Helmuth Lemme: OLEDs—Senkrechtstarter aus Kunststoff, Elektronik 2/2000, pp. 97 to 103; E. Becker et al: Organische Lumineszenz: Neue Technologie für flache Bildschirme, Fernseh- und Kino-Technik, 8-9/2000, pp. 1 to 5).

The production of OLEDs can be accomplished by means of an OVPD (Organic Vapor Phase Deposition, U.S. Pat. No. 5,554,220) technology, in which a carrier gas stream at very low pressure in a heated reactor takes up materials and deposits these as thin layers on a substrate. This substrate can be, for example, an ITO (Indium Zinc Oxide) electrode which previously had been vapor-deposited onto glass. Onto the organic luminescent layer subsequently a further electrode is vapor-deposited and the electrodes with the active luminescent layer have approximately a thickness of 400 nanometers.

In a further method for the coating of a substrate with a thin organic layer, a substrate holder with a heater is provided, which holds on its underside a substrate, for example glass (EP 0 962 260 A1=U.S. Pat. No. 6,101,316). Beneath this substrate, two vaporizer sources are provided, which vaporize organic material which becomes deposited on the substrate if a diaphragm disposed between the substrate and the vaporizer is opened. With this method the uniform coating of substrates over large areas is not possible. Employing two separate vaporizers leads to superpositions of the vaporized materials on the substrate causing nonuniformity of the coating.

A vacuum vaporization installation is furthermore known, which comprises a vaporizer tank in which the material to be vaporized is vaporized. The topside of this vaporizer tank is provided with a hood extending outwardly in the horizontal direction (EP 0 477 474 A1). Linear distribution of the vaporized material is not attainable with this installation.

An apparatus is also known for coating a steel band, which comprises at least one vacuum vaporization container heated by induction. The apparatus is wherein each of the containers has an opening for the outlet of metal vapors and that the outlet opening for the metal vapors has the form of a narrow slot, disposed at a small spacing from the substrate to be coated (WO 96/35822). With this apparatus the linear distribution of vapor is also not possible.

A vaporizer source for the production of organic electroluminescence diodes is described in EP 0 982 411 A1. This source comprises a container of an insulating material, which receives the organic material. Closely around the container is placed a heater, which vaporizes the organic material. The container has a heating zone, which is heated directly by the heater and which is in contact with the organic material via a contact zone. The way in which the coating of substrates takes place is not described in detail.

In order to complete coatings over a large area, it is in principle possible to employ dot-form, line-form or areal vaporizers. While dot-form vaporizers are known for example through EP 0 982 411 A2 and EP 0 962 260 A1, a line-form vaporizer is already known from DE 42 04 938 C1. In the case of this line-form vaporizer, the vaporative deposition onto the substrate takes place from below. The same applies to a line-form vaporizer disclosed in DE 199 21 744 A1.

The disadvantage of dot-form vaporizers consists therein that with them a homogeneous coating on large areas can only be realized if the distance between vaporizer and substrate is large. This requires a coating installation to be very large in order for the distance between vaporizer and substrate to be large. In addition, only a small portion of the vaporizer material is utilized.

Moreover, the vaporizer source must be disposed beneath the substrate which can lead to problems with masks positioned between vaporizer source and substrate, and specifically not before the substrate reaches a size of approximately 300 mm×400 mm and with small structures in the masks.

If linear vaporizer sources are disposed horizontally and underneath a substrate to be coated, problems are encountered with masks starting at approximately 300 mm×400 mm and small structures within the masks, for example with pixel sizes from 0.4 mm×0.4 mm, since in this case the masks are sagging: which leads to inhomogeneous coating. In order to attain a high level of homogeneity with relatively thick layers, the vaporizer sources or the substrate must furthermore be moved slowly relative to one another.

The present invention provides an apparatus for the coating of substrates, which has a reduced space requirement, with which uniform coating can be achieved and with which it is also possible to apply large masks. Methods of using the apparatus to coat substrates are also a part of the invention.

The invention relates to an apparatus for coating an areal substrate, for example a rectangular plate. This apparatus comprises a vaporizer source and a distributor system for conveying vaporized material onto the substrate. The distributor system comprises a line source, with this line source and the substrate being movable relative to one another. The apparatus serves preferably for the production of flat screens with organic light-emitting diodes.

An advantage provided by the invention is that large quantities of areal material can be coated since the substrates are guided past a linear vaporizer source. Masks, disposed between vaporizer source and substrate, do not sag since they are disposed parallel to the areal substrate. In addition, efficient utilization of the vaporized material is made possible, and chemical reactions of vaporized organic materials with the surrounding parts do not take place. Furthermore, thereby that the entire distributor region beyond the crucible and before the final outlet opening is at a defined high temperature, condensation of the vaporized material is prevented without leading to a chemical decomposition of the organic molecules.

An embodiment example of the invention is depicted in the drawings and is described in further detail below.

DETAILED DESCRIPTION

Figure 1:
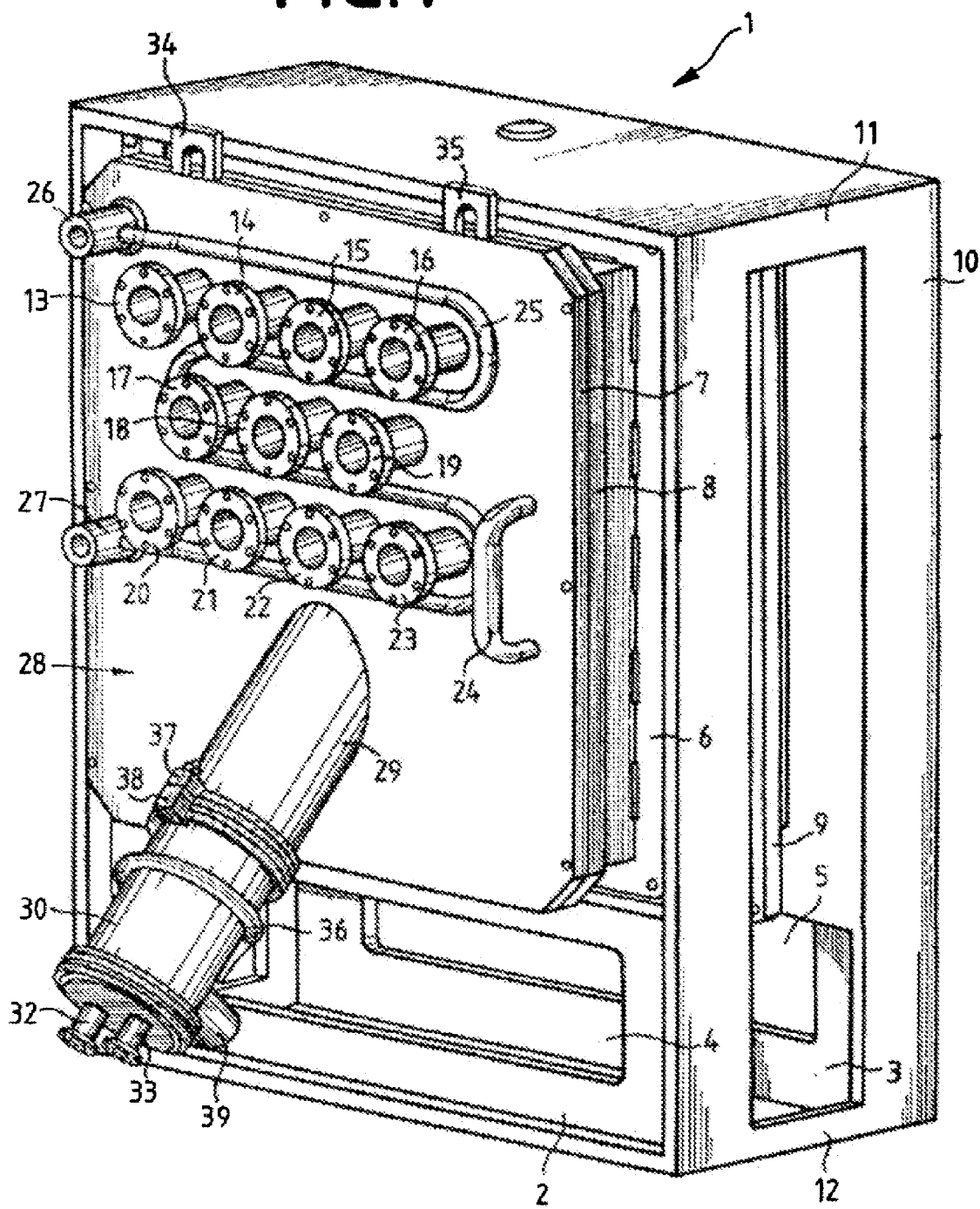
FIG. 1 is a perspective overall view of a coating chamber according to the invention.

FIG. 1 shows a perspective overall view of coating boiler 1 according to the invention having a vaporizer. Coating boiler 1 has a front side 2 and rear side 3. Front side 2 is provided with front opening 4 and rear side 3 is provided with rear opening 5 for the introduction of a drive. Front and rear openings 4 and 5 can be closed again after the introduction of a drive. Disposed above front opening 4 is front plate 6, which supports front carrier plate 7 and rear carrier frame 8.

Parts (housing parts) 10, 11, 12 of coating boiler 1 form a housing, which forms a working region with its own housings disposed next to one another, which are not depicted in FIG. 1.

A substrate 9, for example a glass plate, can be moved through the working regions disposed one next to the other and be worked in a manner which is different in each case. The overall installation, not shown here, is thus structured modularly, with the coating boiler 1 representing one of several modules. The chamber, in which the substrate 9 is coated, without a process has a base pressure of less than $10^{-4}$ Pa and with a process of less than $10^{-2}$ Pa, with this pressure being a function of the vaporization rates.

Carrier plate 7 and carrier frame 8 are connected with one another, with several flanged measuring tubes 13 to 23 each projecting from front carrier plate 7. For example, the flanged measuring tube 13 may be observation tube having a glass covering, through which substrate 9 may be viewed. In the flanged measuring tube 14, a thermocouple can be disposed, while in flanged measuring tube 15 a quartz oscillator can be disposed, with which the vaporizer rate of the vaporizer source may be measured. Handle 24 may be provided to make it possible to lift carrier plate 7 and carrier frame 8 like a door from the rest of coating boiler 1. Cooling tubing 25 for cooling carrier plate 7 and carrier frame 8 is wound about the flanged measuring tubes) 13 to 23, and specifically such that the cooling tubing extends from connection pipe 26 for cooling fluid above flanged measuring tubes 13 to 16, combined into a first group, and is subsequently guided beneath these flanged measuring tubes 13 to 16 and thus above additional flanged measuring tubes 17 to 19, combined into a second group, and, lastly, beneath a third group of flanged measuring tubes 20 to 23 is connected with a further connection pipe 27 for the cooling fluid.

Disposed between the flanged measuring tubes 13 to 23 and opening 4 is a vaporizer source 28 which includes front tube 29 and rear tube 30. Both front and rear tubes 29, 30 are held together by connection clamps 37, 38, which are provided for receiving connection bolts. At the lower end of rear tube 30 are disposed two ports 32, 33, to which for example a power source can be connected. A cooling tube 36 is guided about rear tube 30, which is connected with cooling means port 39. Suspension hooks 34, 35 are provided, with which carrier plate 7 forming a door or carrier frame 8 can be raised.

Not shown in FIG. 1 is a mask, which is conventionally disposed parallel to the substrate 9, and specifically between substrate 9 and front plate 6. Since the mask is oriented vertically, the sagging due to gravity is excluded.

Substrate 9 is oriented vertically, i.e. parallel to the direction of the gravitational force of the earth. However, minor deviations from parallelity are permitted, i.e., the substrate is substantially parallel with the earth's gravity. The entire coating boiler 1 can, for example, for reasons not further explained here, be inclined by approximately 7° with respect to the vertical. The invention prevents or minimizes sagging of potential masks. If the mask, due to an oblique position of the substrate 9 rests on the top side of this substrate 9, it cannot sag.

Figure 2:
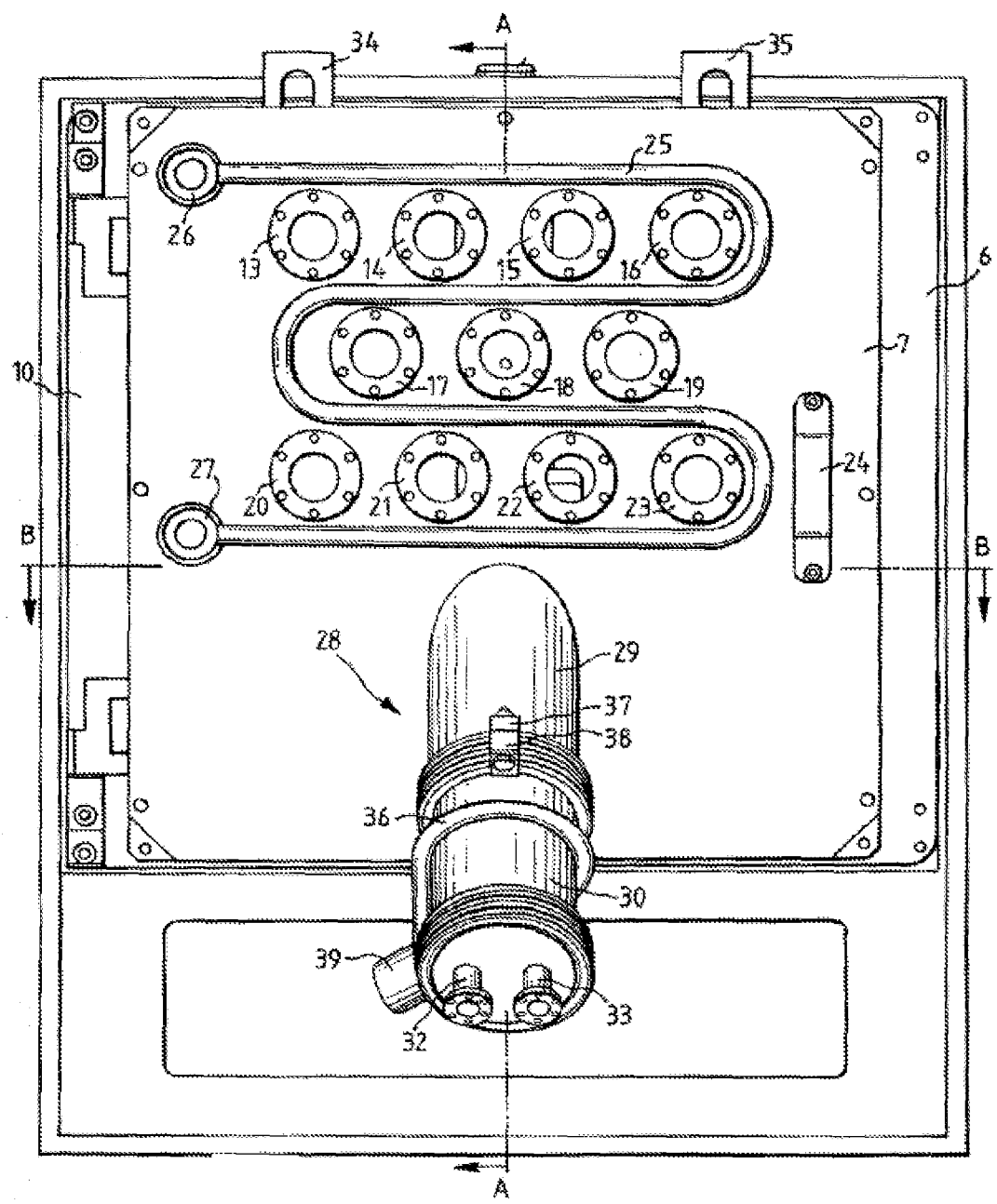
FIG. 2 is a front view of the coating chamber according to FIG. 1.

In FIG. 2 the same configuration as in FIG. 1 is once again depicted in front view. Evident here are vaporizer source 28, flanged obliquely onto front carrier plate 7, flanged measuring tubes 13 to 23, cooling tubing 25, and handle 24. In addition, sectional lines A-B or B-B are shown, which characterize the sections depicted in FIGS. 3 and 4.

Figure 3:
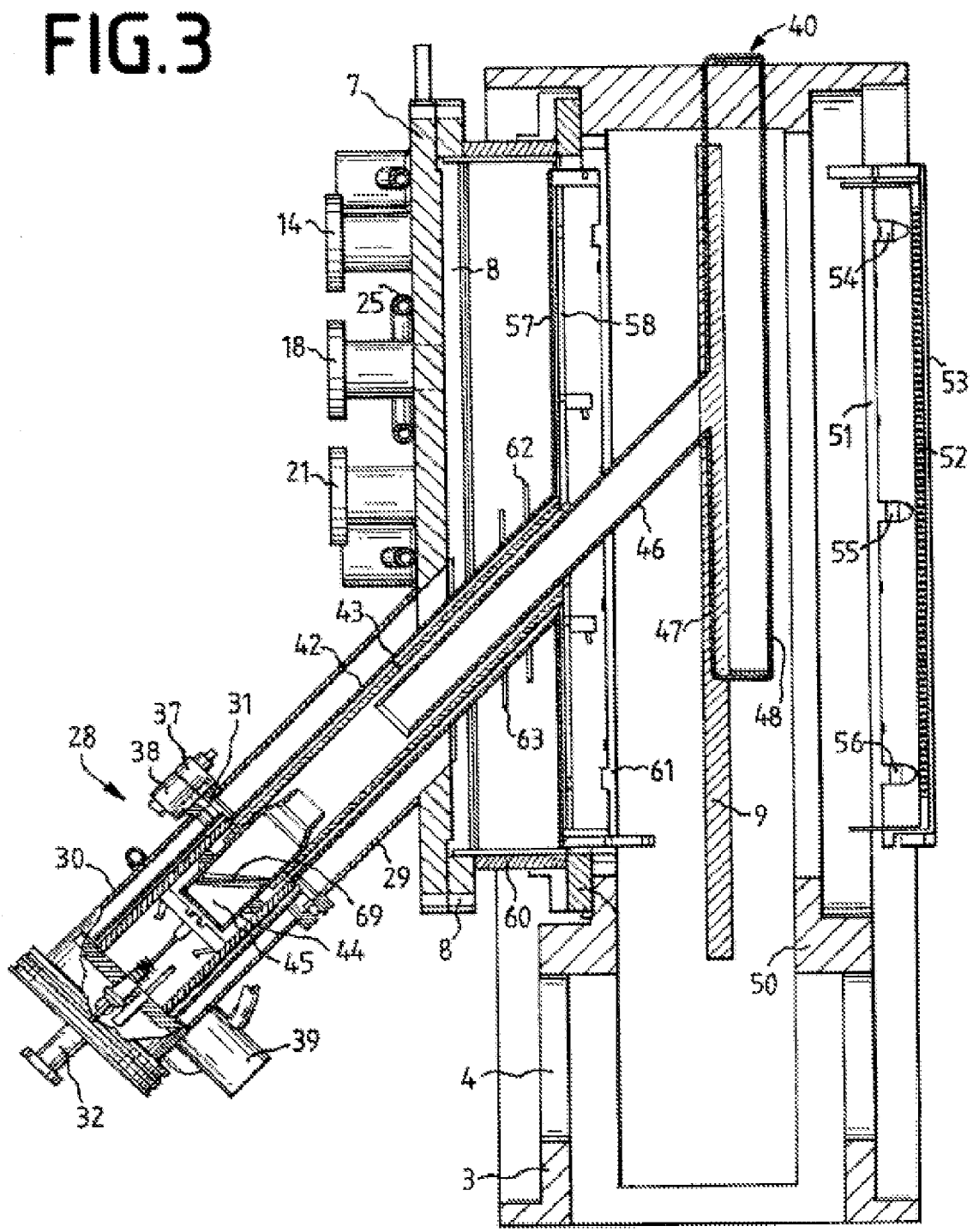
FIG. 3 is a section A-A through the chamber according to FIG. 2.

The sectional representation depicted in FIG. 3 shows carrier plate 7 with the measuring tubes and their flanges 14, 18, 21 as well as the substrate 9 and the tubes 29, 30 of the vaporizer source 28. Substrate 9 is for example a glass plate, which can be moved into the plane of drawing and out of it. The retention and the drive for this substrate 9 are not shown in FIG. 3. The same applies to the retention and the drive of a mask, potentially on the left next to the substrate 9, which can cover the entire surface of substrate 9.

Within tube 29 is disposed a ceramic tube 43, which is encompassed by a metal shielding tube 42. At the lower end of the ceramic tube 43 is provided a crucible 44, whose front portion connects to a quartz tube 46. In the representation of FIG. 3, this quartz tube 46 is pulled out such that the distance between its lower end and the crucible 44 is relatively large. The obliquely disposed quartz tube 46 transitions at its front end into the rear wall 47 of a vertically oriented quartz tube 40, which, on its side 48 facing away from the quartz tube 46, is provided with several holes disposed on a vertical line. These holes are depicted in further detail in FIG. 7.

The vertically disposed quartz tube 40 is encompassed by two halves 52, 58 of a ceramic tube, which, in the representation of FIG. 3, are pulled apart to the left and the right. In the assembled state and during operation, the two halves 52, 58 are brought together such that they form a tubular unit which encompasses the quartz tube 40. It is particularly preferred that quartz tube 40 is arranged in a plane parallel to the surface of the substrate.

The two halves 52, 58 of the ceramic tube are, in turn, encompassed by metal tube halves 53, 57. The halves 52, 53 of the ceramic tube or of the metal tube provided on the right side have holes at the same site as the vertical quartz tube 40. The holes of the three tubes are thus positioned one beyond the other and form a line source.

During operation, the lower end of quartz tube 46 is connected with crucible 44 such that the material vaporized from crucible 44 is conducted through the oblique quartz tube 46 into the vertical quartz tube 40, which is encompassed by ceramic halves 52, 58 and metal tube halves 53, 57. The vaporized material now is conducted through the vertically disposed holes of quartz tube 40 and through the holes of halves 52, 53 of the ceramic or the metal tube into the chamber in which the substrate 9 is disposed. Since these holes—in contrast to the representation of FIG. 3—during operation are disposed on the left of substrate 9, substrate 9 is acted upon with the vaporized material.

If a mask is disposed between the metal tube 53 and substrate 9, the vaporized material first reaches this mask before it arrives on substrate 9.

Past the line source, formed by the vertically disposed holes of quartz tube 40, of ceramic tube 52, 58 and of metal tube 53, 57 the substrate 9 is guided out of the plane of drawing or into the plane of drawing. In this way, the continuous coating of a large substrate area is possible.

Figure 6:
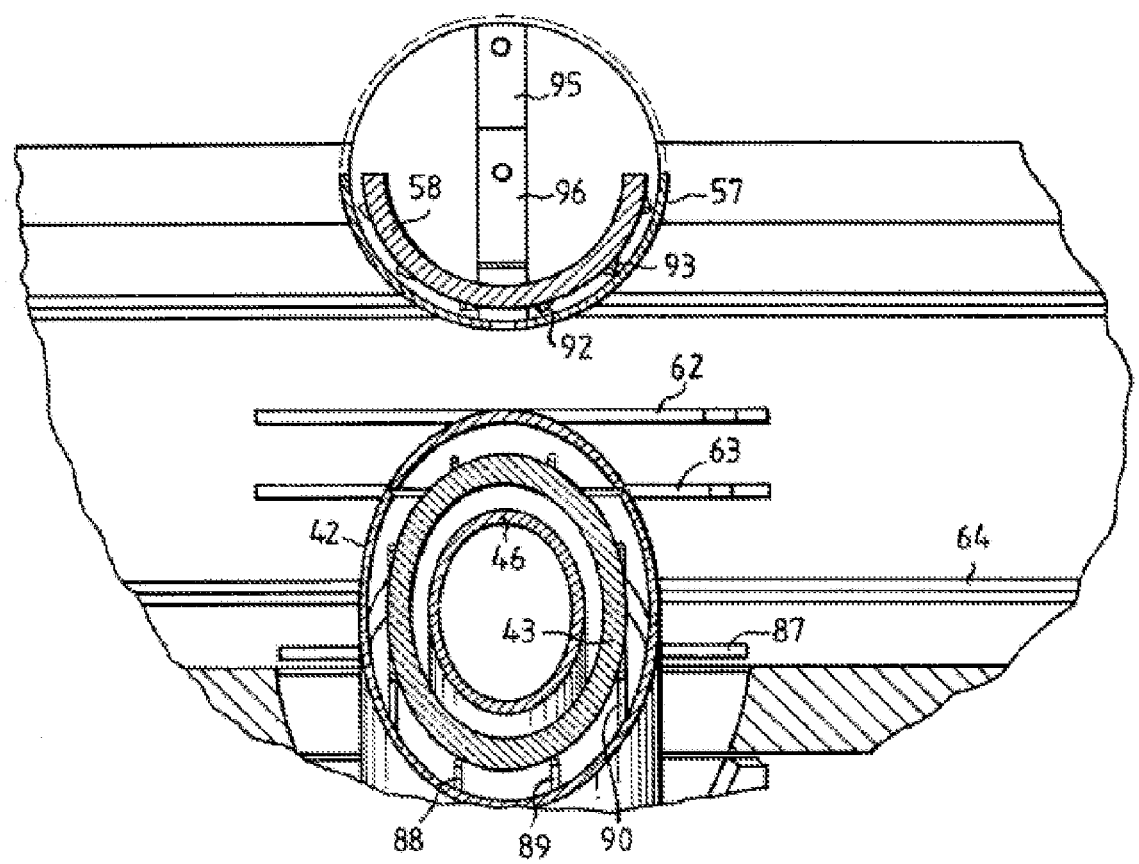
FIG. 6 is an enlarged partial representation from FIG. 4.

The temperature of crucible 44 and the temperature of the distributor system containing tube 40 and 46, are regulated separately, and the precise regulation of the temperature for the range between 100° and 800° C. must be ensured. The entire distributor system succeeding the crucible 44 must be at a defined high temperature, which prevents condensation on surfaces exposed to the vapor, e.g., the walls of the coating boiler 1, walls of the distributor system, including tubes 40 and 46 bores or slots therein and corresponding bores or slots, but does not thermally decompose organic molecules. As explained in conjunction with FIG. 6, the uniformity of the temperature is best achieved through indirect heating by means of radiation. The homogeneity of the coating of substrate 9 is attained through a ratio, adapted to the vaporization rate, of the diameters of tubes 40, 46 to the area of the outlet opening comprised of many small holes or a slot. The outlet opening can advantageously be kept free of coating through specific tempering.

The distance between the front side 48 of tube 40 and substrate 9 during operation should be kept as small as feasible. With the apparatus depicted in FIGS. 1 to 3 it is feasible to replenish coating material with only the crucible region needing to be ventilated. It is furthermore possible to bring the crucible 44 maintained under vacuum or protective gas to the distributor system without ventilating the crucible, the entire source or the installation. It is also possible to provide two vaporizer crucibles, which vaporize different materials, and the two material vapors are homogeneously mixed in the distributor system.

Figure 4:
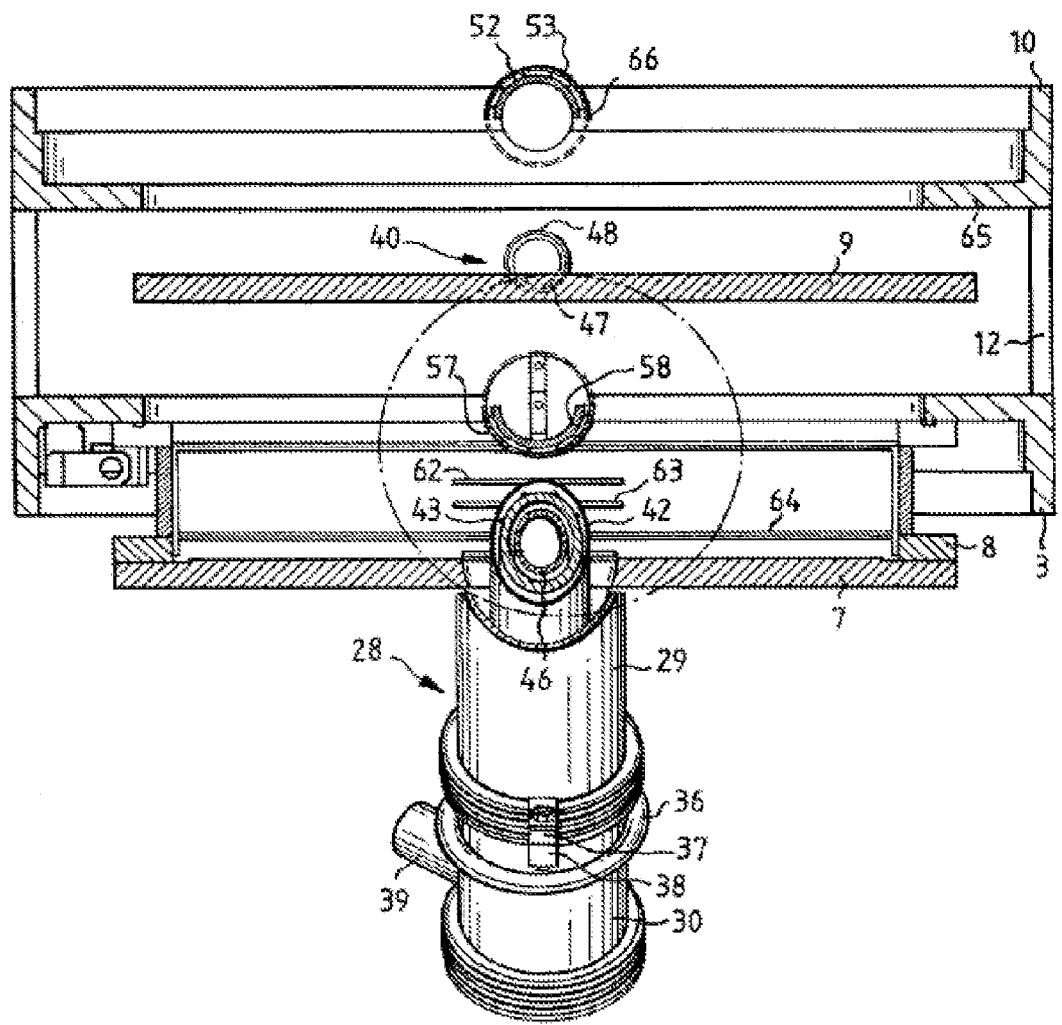
FIG. 4 is a section B-B through the chamber according to FIG. 2.

In FIG. 4 is shown a section B-B through the coating boiler 1. Evident are again the two tubes 29, 30, the cooling tubing 36, and the plate 7 or the frame 8.

Tube 29 is sectioned through such that in it the metal tube 42 and in it the ceramic tube 43 and in it the quartz tube 46 are evident. The vertical quartz tube 40 with its front side 48 and its rear side 47 can be seen approximately at the level of substrate 9. In front of it is disposed the one half 52 of the ceramic tube and the one half 53 of the metal tube. Behind the quartz tube 40 is evident the other half 58 of the ceramic tube and the other half 57 of the metal tube. On the metal tube 42 flanged on obliquely with respect to the carrier plate 7 are disposed two adjusting aids 62, 63 which serve for the purpose of orienting the metal tube 42 such that the vertical holes of the line source are directed perpendicularly onto the substrate 9.

Figure 5:
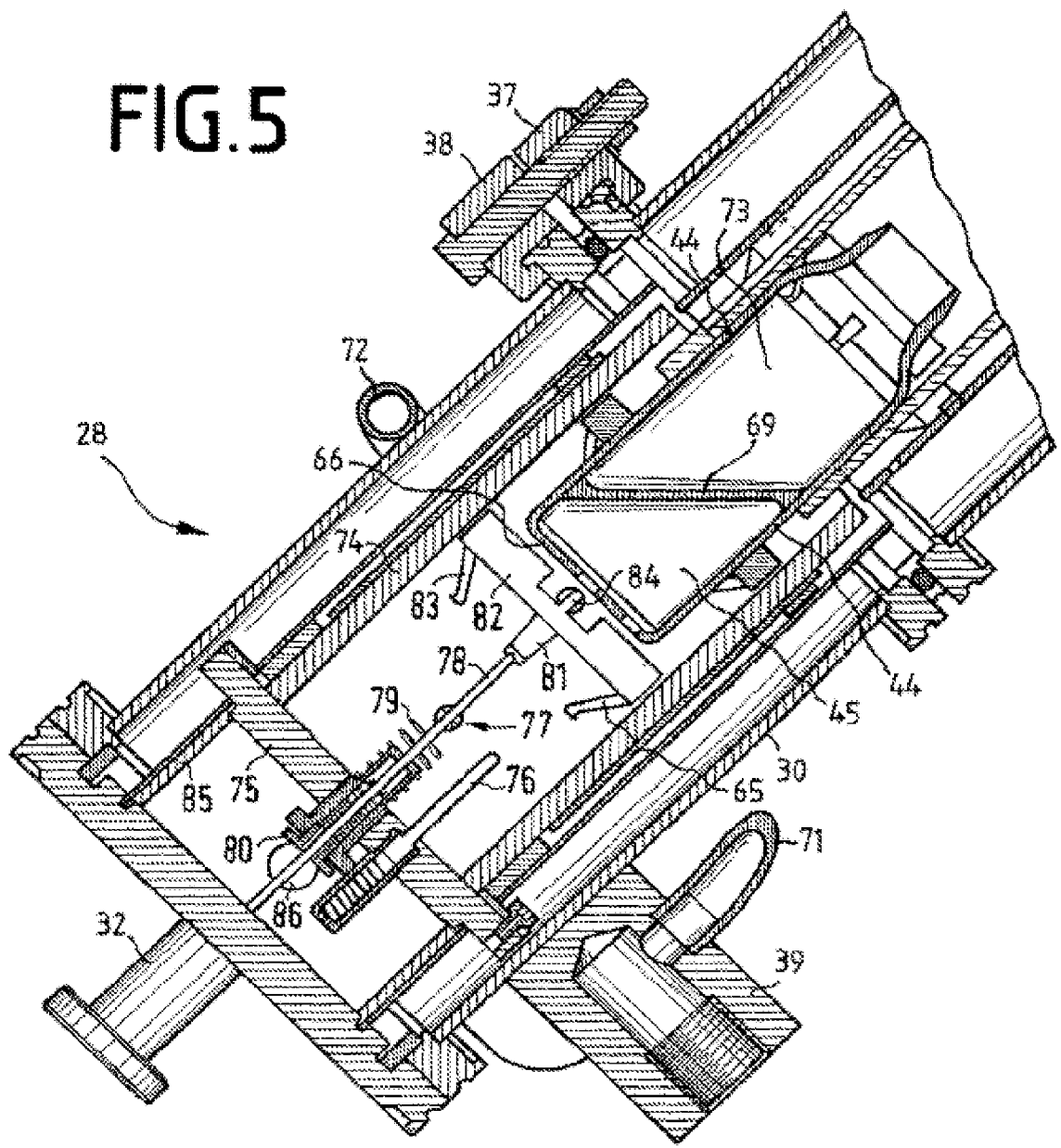
FIG. 5 is an enlarged sectional representation of the crucible according to FIG. 3.

FIG. 5 shows the lower region of vaporizer 28 according to FIG. 3 at an enlarged scale.

Crucible 44 is divided by a partition wall 69 into an upper chamber 73 and into a lower chamber 45. In the upper chamber 73 is located the organic substance, which is to be vaporized. Which substance is involved here is shown, for example, in Illustration 4 of the above cited paper by E. Becker et al. Possible materials for the electron transport are in particular (Alq$_3$, PBD), for the light emission (Alq$_3$, 1-AZM-Hex, OXD-8, doping substances: Ph-Qd, DCM, Eu(TTFA)$_3$Phen) as well as for the hole transport (CuPc, TNATA, TAD, NPD). Other substances are also possible (cf. WO 99/25894, Claim 6).

The crucible 44 is comprised of quartz glass. However, it is also possible to employ crucibles of tantalum, molybdenum or tungsten. It must be ensured in every case that the crucible 44 does not react chemically with the material disposed in it.

The oblique bottom 69 of the upper chamber 73 of crucible 44 ensures that this bottom 69 is oriented parallel to the earth's surface. Opposite the bottom 66 of the empty chamber 45 of crucible 44 is provided a support 82 with staying springs 83, 65, 81. A heat sensor 78, 84, which is disposed with its upper portion 84 in the proximity of the bottom 66 or also introduced into chamber 45, is encompassed in its lower region by a coil spring 79. A cooling means inlet 39 is connected with a cooling fluid line 71. By 85 is denoted a short steel tube, which is provided with a hole 86, through which the feed lines or the like can be introduced.

FIG. 6 shows once again an enlarged detail from FIG. 4. Herein several heating wires 88 to 90 or 92, 93 can be seen, which are disposed on the outside of the ceramic tube 43 or 58, in order to heat it such that the ceramic tube 43 or 58 can indirectly heat the quartz tube 46 or 40. Instead of heating rods 88 to 90, 92, 93, it is also possible to provide numerous small heating coils or other heating elements. By 96, 95 are denoted portions of a cover disposed at the lower end of metal tube 53, 57.

Figure 7:
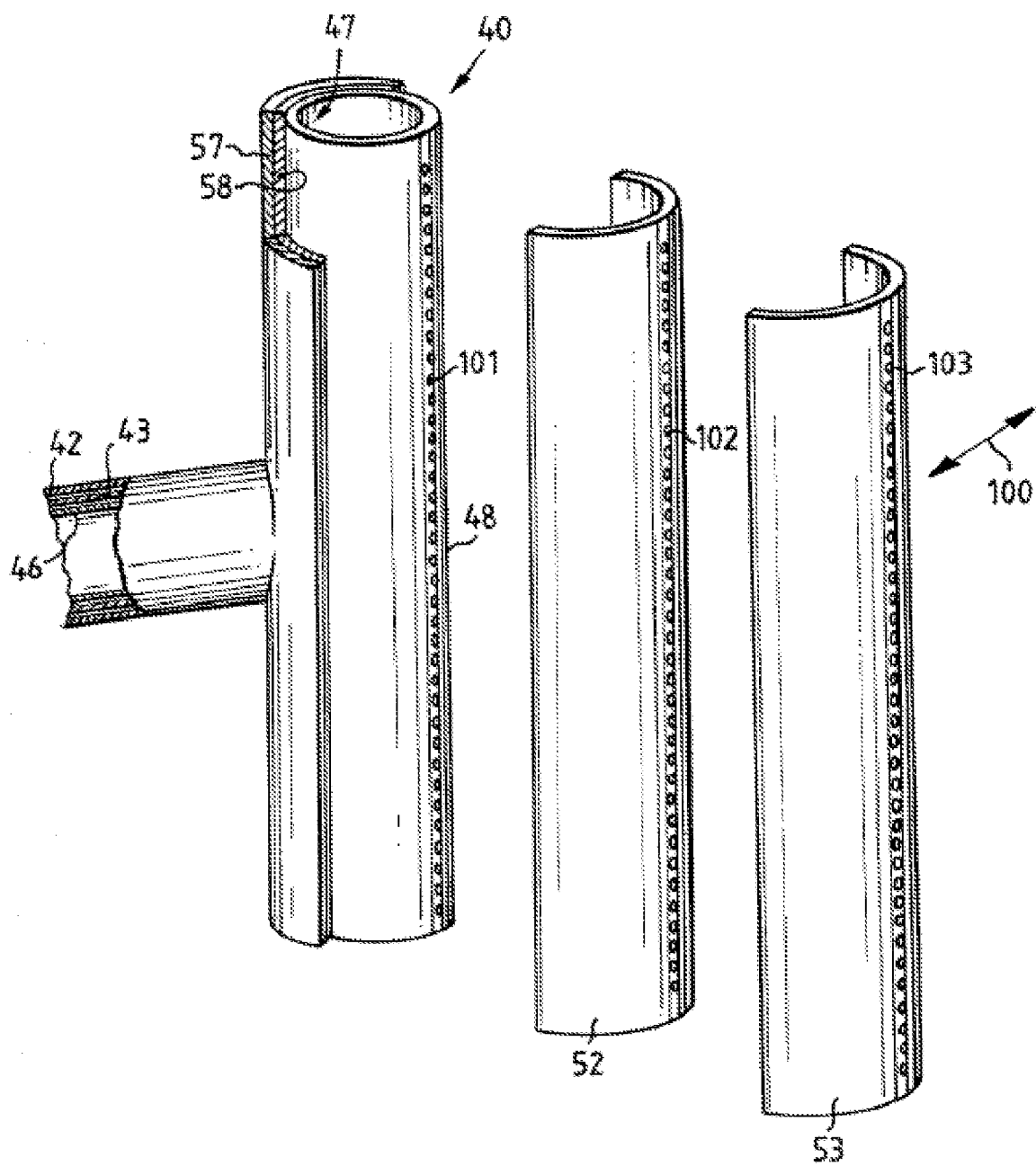
FIG. 7 is a perspective exploded drawing of a distributor for distributing the vaporized material.

In FIG. 7 are represented once again in perspective view essential components of the distributor system, which distributes the material vaporized in crucible 44 onto the substrate. The one end of quartz tube 46 is connected with crucible 44, not shown here, while the other end of this quartz tube 46 terminates obliquely, i.e. approximately at an angle of 45°, in the quartz tube 40. About the quartz tube 46 is placed the ceramic tube 43, which in turn is encompassed by the metal tube 42. The ceramic or the metal of tubes 43 or 42 are selected such that they do not enter into reaction with the vaporized material.

All three tubes 42, 43, 46, flanged on at an angle of approximately 45°, are partially shown in section. Tubes 42, 43 terminate in semitubes 57, 58, which are comprised of the same material as they themselves are.

These semitubes 57, 58, shown in exploded view, are opposed by the ceramic semitube 52 and the metal semitube 53.

Semitubes 58 and 52 or 57 and 53, respectively, are connected with the aid of clamps or other connecting means, such that in the operating state the two quartz tubes 46 and 40 are each encompassed by one ceramic tube, which, in turn, is encompassed by a metal tube.

In order for the substrates, which are moved perpendicularly to the longitudinal axis of quartz tube 40 in the direction of arrow 100, to be acted upon by a line-form vaporizer source, in the quartz rube 40 as well as also in the ceramic semitube 52 and the metal semitube 53 numerous opposing bores 101, 102, 103 are provided, which together form a line source. By employing several bores disposed in a line, a better distribution of the vaporized material takes place in comparison to a longitudinal slot. This applies in particular to the quartz tube 40, where the initial distribution of the vaporized material takes place. It would be possible, however, for a continuous slot to be provided in the metal semitube 53, without the uniform distribution of the vaporized material being hereby significantly affected. However, also pure slots in the ceramic semitube 52 and/or the quartz tube 40 is in principle possible.

As already emphasized, the orientation of the substrate and its direction of movement parallel or perpendicularly to the gravitational force of the earth is to be understood as meaning that sagging of a potentially present mask is prevented. This would also be case if the mask were to rest on the top side of a substrate oriented transversely to the direction of the earth's gravitational force and a coating "from above" were to take place.

It is further understood that, instead of a stationary vaporizer source toward which a substrate is moved, a stationary substrate could also be provided, past which a vaporizer source is guided.

It is claimed:

1. An apparatus for coating an areal substrate, comprising:
    a coating chamber;
    a stationary vaporizer source to produce a vapor by vaporizing materials with which the substrate is to be coated;
    a drive which linearly moves the areal substrate relative to the vaporizer source;
    a first distributor vertically disposed in the coating chamber which linearly distributes the vapor by the vaporizer source on said substrate, whereby the direction of vapor emission of said first distributor is substantially normal to the surface of the areal substrate and wherein linear distribution of the vapor takes place through several holes disposed in a substantially vertical straight line;
    a second distributor having one end disposed at least in the proximity of the vaporizer source and another end that terminates in the first distributor;
    wherein the first distributor and the second distributor are each encompassed by a sleeve, wherein the sleeves are provided with electric heating elements.

2. An apparatus as claimed in claim 1, wherein the first distributor extends substantially parallel to the surface of the substrate and to the earth's gravitational force.

3. An apparatus as claimed in claim 1, wherein the first distributor is a quartz tube.

4. An apparatus as claimed in claim 1, wherein the second distributor is a quartz tube.

5. An apparatus as claimed in claim 1, wherein the sleeves are ceramic sleeves and wherein the ceramic sleeve about the first distributor comprises two halves, wherein in one of the two halves several holes disposed on a straight line are provided.

6. An apparatus as claimed in claim 5, wherein the ceramic sleeves are each encompassed by a metal sleeve.

7. An apparatus as claimed in claim 6, wherein the metal sleeve about the ceramic sleeve of the first distributor comprises two halves, wherein in one of said two halves several holes are disposed in a straight line.

8. An apparatus as claimed in claim 1, wherein at least one of the first or second distributors can be indirectly heated.

9. An apparatus as claimed in claim 1, wherein a crucible is coupled with one of the distributors.

10. An apparatus as claimed in claim 9, wherein the crucible is divided by an oblique partition wall into an upper region and a lower region, wherein in the upper region is disposed the material to be vaporized, while the lower region is an empty chamber.

11. An apparatus as claimed in claim 10, wherein opposite a bottom of crucible is provided a support with a temperature sensor.

12. An apparatus as claimed in claim 10, further comprising a heat sensor positioned in the lower region of said crucible.

13. An apparatus as claimed in claim 1, wherein the material vaporized in the vaporizer source is an organic substance.

14. An apparatus as claimed in claim 1, wherein the second distributor is attached at an angle of approximately 45° onto the first distributor.

15. An apparatus as claimed in claim 1, further comprising a coating boiler with a door, wherein the vaporizer source is flanged on an outside of the coating boiler.

16. An apparatus as claimed in claim 15, wherein the coating boiler is slightly inclined relative to the direction of the earth's gravitational force.

17. An apparatus as claimed in claim 16, wherein the inclination is 7°.

18. An apparatus as claimed in claim 1, wherein the electric heating elements are arranged outside of said sleeves.

19. An apparatus as claimed in claim 1, wherein the drive moves the substrate substantially perpendicularly to the earth's gravitational force, and wherein the substrate is oriented such that the normal extends substantially perpendicularly to the direction of the earth's gravitational force.

20. An apparatus as claimed in claim 1, wherein the vaporizer source is disposed outside of the chamber and can be attached, when operative, to deliver vaporized organic materials into a cavity of the first and second distributors.

21. An apparatus as claimed in claim 20, further comprising a means for detaching or for sealingly attaching the vaporizer source.

22. An apparatus as claim in claim 1, wherein the vaporizer source comprises a housing having an interior volume, and a support, whereby a crucible is held by the support inside the interior volume.

23. An apparatus as claimed in claim 1, wherein the vaporizer source comprises a crucible, wherein a temperature of the crucible is regulatable and precisely adjustable at least within a range of 100° C. to 800° C.

24. An apparatus as claimed in claim 1, wherein the sleeves are ceramic sleeves.

25. An apparatus as claimed in claim 1, wherein the first distributor is located within a vacuum chamber, and wherein the vacuum chamber has a base pressure of less than $10^{-4}$ Pa.

26. An apparatus comprising:
    a vaporizer source configured to produce a vapor output of vaporized material with which a substrate is to be coated, said vaporizer source comprising a front tube, a rear tube detachably connected to the front tube, a crucible to hold material to be vaporized, and a support to hold the crucible in a volume defined by an interior of the front tube and the rear tube when connected, wherein the crucible is removable from the volume when the rear tube is detached from the front tube;

a first distributor inside a vacuum chamber of the apparatus having a plurality of holes therein that linearly distributes the vapor output by said vaporizer source; and a second distributor comprising a first end that operatively communicates with the vaporizer source and a second end that communicates with said first distributor;

wherein the first distributor or the second distributor is encompassed by a sleeve, and wherein the sleeve is provided with an electric heating element.

27. An apparatus as claimed in claim 26, wherein said front tube and said rear tube of said vaporizer source are connected by clamps.

28. An apparatus as claimed in claim 26, wherein said rear tube of said vaporizer source has at least one port.

29. An apparatus as claimed in claim 28, wherein the port is connected to a power source.

30. An apparatus as claimed in claim 26, wherein a cooling tube is connected to said rear tube.

31. An apparatus as claimed in claim 26, wherein said front tube of the vaporizer source is flanged to a carrier plate of the apparatus.

32. An apparatus as claimed in claim 26, wherein the sleeve is a ceramic sleeve and wherein the ceramic sleeve comprises two halves and surrounds the second distributor.

33. An apparatus as claimed in claim 32, wherein said ceramic sleeve is encompassed by a metal sleeve.

34. An apparatus as claimed in claim 26, wherein a metal sleeve around a ceramic sleeve of the first distributor comprises two halves, wherein in one of the two halves several holes are disposed in a straight line.

35. An apparatus as claimed in claim 26, wherein at least one of the first or second distributors can be indirectly heated.

36. An apparatus as claimed in claim 26, wherein the crucible is coupled to one of the first or second distributors.

37. An apparatus as claimed in claim 26, wherein the material to be vaporized in the vaporizer source is an organic substance and is contained in said vaporizer source.

38. An apparatus as claimed in claim 26, wherein said crucible is coupled to the second distributor.

39. An apparatus as claimed in claim 26, wherein the crucible is divided by an oblique partition wall into an upper region and a lower region, wherein in the upper region is disposed the material to be vaporized, while the lower region is an empty chamber.

40. An apparatus as claimed in claim 39, further comprising a heat sensor positioned in the lower region of said crucible.

41. An apparatus as claimed in claim 26, wherein opposite a bottom of said crucible is provided a support with a temperature sensor.

42. An apparatus as claimed in claim 26, further comprising a coating boiler with a door, wherein the vaporizer source is flanged on an outside of the boiler.

43. An apparatus as claimed in claim 42, wherein, the coating boiler is slightly inclined relative to the direction of the earth's gravitational force.

44. An apparatus as claimed in claim 43, wherein the inclination is 7°.

45. An apparatus as claimed in claim 26, further comprising electrically heatable elements outside of said sleeve.

46. An apparatus as claimed in claim 26, further comprising a heat sensor.

47. The apparatus of claim 26, further comprising a retention and a drive for said substrate.

48. The apparatus of claim 26, wherein the front tube is attached to the apparatus and the second distributor is at least partially disposed inside the front tube.

49. An apparatus as claimed in claim 26, wherein a temperature of the crucible is regulatable and precisely adjustable at least within a range of 100° C. to 800° C.

50. An apparatus as claimed in claim 26, wherein the sleeve is a ceramic sleeve.

51. An apparatus as claimed in claim 26, wherein the vacuum chamber has a base pressure of less than $10^{-4}$ Pa.

* * * * *

UNITED STATES PATENT AND TRADEMARK OFFICE
CERTIFICATE OF CORRECTION

PATENT NO.       : 8,012,260 B2
APPLICATION NO.  : 10/164337
DATED            : September 6, 2011
INVENTOR(S)      : Uwe Hoffmann, Jutta Trube and Dieter Haas It is certified that error appears in the above-identified patent and that said Letters Patent is hereby corrected as shown below:

IN THE CLAIMS:

In Claim 22, column 8, line 45, after "as" delete "claim" and insert -- claimed --.

Signed and Sealed this
Twentieth Day of March, 2012

David J. Kappos
*Director of the United States Patent and Trademark Office*